(12) United States Patent
Hush

(10) Patent No.: US 6,873,538 B2
(45) Date of Patent: Mar. 29, 2005

(54) PROGRAMMABLE CONDUCTOR RANDOM ACCESS MEMORY AND A METHOD FOR WRITING THERETO

(75) Inventor: Glen Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/022,722

(22) Filed: Dec. 20, 2001

(65) Prior Publication Data

US 2003/0117831 A1 Jun. 26, 2003

(51) Int. Cl.[7] .............................................. G11C 11/00
(52) U.S. Cl. ....................... 365/148; 365/100; 365/158
(58) Field of Search ................................ 365/148, 100, 365/158, 203

(56) References Cited

U.S. PATENT DOCUMENTS

| | | |
|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |

(Continued)

FOREIGN PATENT DOCUMENTS

| | | |
|---|---|---|
| EP | 0 274 828 | 7/1988 |
| JP | 56126916 | 10/1981 |
| WO | WO 97/48032 | 12/1997 |
| WO | WO 99/28914 | 6/1999 |
| WO | WO 00/48196 | 8/2000 |
| WO | WO 01/45108 A1 | 6/2001 |
| WO | WO 02/21542 | 3/2002 |

OTHER PUBLICATIONS

Abdel–All, A.; Elshafie,A.; Elhawary, M.M., DC electric–field effect in bulk and thin–film Ge5As38Te57 chalcogenide glass, Vacuum 59 (2000) 845–853.

(Continued)

Primary Examiner—Huan Hoang
(74) Attorney, Agent, or Firm—Dickstein Shapiro Morin & Oshinsky LLP

(57) ABSTRACT

The present invention provides an improved write circuit and method for writing a programmable conductor random access memory (PCRAM) cell. The method comprises precharging a bit line to a first voltage and applying a second voltage to a first terminal of a chalcogenide memory element. A second terminal of the chalcogenide memory element is selectively coupled to the bit line to produce a voltage across the memory element sufficient to write a predetermined resistance state into the element. The first voltage may take on two different values to program two different resistance states into the memory element.

35 Claims, 6 Drawing Sheets

U.S. PATENT DOCUMENTS

| | | |
|---|---|---|
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki et al. |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,112 A | 6/1998 | Murray et al. |
| 5,761,115 A | 6/1998 | Kozicki et al. |
| 5,789,277 A | 8/1998 | Zahorik et al. |
| 5,825,046 A | 10/1998 | Czubatyj et al. |
| 5,841,150 A | 11/1998 | Gonzalez et al. |
| 5,846,889 A | 12/1998 | Harbison et al. |
| 5,883,827 A * | 3/1999 | Morgan ............... 365/100 |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,188,615 B1 * | 2/2001 | Perner et al. ............... 365/148 |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowrey et al. |
| 6,414,376 B1 | 7/2002 | Thakur et al. |
| 6,418,049 B1 | 7/2002 | Kozicki et al. |
| 6,423,628 B1 | 7/2002 | Li et al. |
| 6,429,064 B1 | 8/2002 | Wicker |
| 6,437,383 B1 | 8/2002 | Xu |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B2 | 1/2003 | Hudgens et al. |
| 6,511,867 B2 | 1/2003 | Lowrey et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowrey et al. |
| 6,555,860 B2 | 4/2003 | Lowrey et al. |
| 6,563,164 B2 | 5/2003 | Lowrey et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowrey |
| 6,576,921 B2 | 6/2003 | Lowrey |
| 6,586,761 B2 | 7/2003 | Lowrey |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowrey et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowrey et al. |
| 6,671,710 B2 | 12/2003 | Ovshinsky et al. |
| 6,673,648 B2 | 1/2004 | Lowrey |
| 6,673,700 B2 | 1/2004 | Dennison et al. |
| 6,674,115 B2 | 1/2004 | Hudgens et al. |
| 6,687,153 B2 | 2/2004 | Lowrey |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowrey |
| 6,714,954 B2 | 3/2004 | Ovshinsky et al. |
| 2001/0012214 A1 | 8/2001 | Akita et al. |
| 2002/0000666 A1 | 1/2002 | Kozicki et al. |
| 2002/0072188 A1 | 6/2002 | Gilton |
| 2002/0106849 A1 | 8/2002 | Moore |

| | | |
|---|---|---|
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0163828 A1 | 11/2002 | Krieger et al. |
| 2002/0168820 A1 | 11/2002 | Kozicki et al. |
| 2002/0190350 A1 | 12/2002 | Kozicki |
| 2003/0001229 A1 | 1/2003 | Moore et al. |
| 2003/0027416 A1 | 2/2003 | Moore |
| 2003/0035314 A1 | 2/2003 | Kozicki |
| 2003/0035315 A1 | 2/2003 | Kozicki |
| 2003/0048744 A1 | 3/2003 | Ovshinsky et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

OTHER PUBLICATIONS

Adler, D.; Moss, S.C., Amorophous memories and bistable switches, J. Vac. Sci. Technol. 9 (1972) 1182–1189.

Adler, D.; Henisch, H.K.; Mott, S.N., The mechanism of threshold switching in amorophous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx; Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980): L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differerential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–x–Se1+x thin film structures, Phys. Stat. Sol. (a) 74 (1982) 217–224.

Bondarev, V.N.; Pikhista, P.V., A dendrite model of current instability in RbAg4I5, Solid State Ionics 70/71 (1994) 72–76.

Boolchand P., The maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–195.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) 17th (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P. Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L. , Whisker growth induced by Ag photodoping in glassy GexSe1-x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R.; Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2-xSe1+x/n-Si diodes, Thin Solid Films 110 (1983) 107–113.

El Gharras, Z.; Bourahla, A.; Vautier, C., Role of photoinduced defects in amorphous GexSe1-x photoconductivity, J. Non–Cryst. Solids 155 (1993) 171–179.

El Ghrandi R.; Calas, J.; Galibert, G.; Averous, M., Silver photodissolution in amorphous chalcogenide thin films. Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold switching in semiconductor glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80-x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C.; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film,. Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Crp+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japan. J. Appl. Phys. 26 (1987) 15–21.

Kawasaki, M.; Kawamura, J.; Nakamura, Y.; Aniya, M., Ionic conductivity of Agx(GeSe3)1–x (0>=x=>=0.571) glasses, Solid state Ionics 123 (1999) 259–269.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan,. K.N.; Srivastava, K.K.; Panwar, O.S.; Dumar, A.; Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L., Reversible and irreversible electrical switching in TeO2–V2O5 based glasses, Journal de Physique IV 2 (1992) C2–185–C2–188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Mitkova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The Application of amorphous materials to computer memories, IEEE transactions on electron dev. Ed–20 (1973) 195–209.

Ovshinsky, S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi,W.K.; Snell,A.J.;Owen,A.E., Amorphous silicon analogue memory devices, J. Non–Cryst. Solids 115 (1989) 168–170.

Rose,M.J.;Snell,A.J.;Lecomber,P.G.;Hajto,J.;Fitzgerald, A.G.;Owen,A.E., Aspects of non–volatility in a —Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenum films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M.; Electric field enhanced phase separation and memory switching in amorphous arsenic triselenide, Journal(??) (1972) 4609–4612.

Tichy, L.; Ticha, H., Remark on the glass–forming ability in GexSe1–x and AsxSAe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.; Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium, Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satlow, T., Thermally induced crystallization of amorphous Ge0.4Se0.6, J. Non–Cryst. Solids 117–118 (1990) 219–221.

Uttecht, R.; Stevenson, H.; Sle, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaivour of amorphous selenium films, J. Non–Cryst. Solids 33 (1976) 267–272.

Vodenicharov, C.; Parvanov, S.; Petkov, P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behaviour in the slope |dTg/d<m>| at the rigidity precolation threshold (<m>=2.4), J. Non–Cryst. Solids 151 (1992) 149–154.

Axon Technologies Corporation, Technology Description: Programmable Metallization Cell(PMC), pp. 1–6 (Pre–May 2000).

Helbert et al., Intralevel hybrid resist process with submicron capability, SPIE vol. 333 Submicron Lithography, pp. 24–29 (1982).

Hilt, Dissertation: Materials characterization of Silver Programmable Metalization Cells, Arizona State University, pp. Title page–114 (UMI Company, May 1999).

Hirose et al., High Speed Memory Behavior and Reliability of an Amorphous $As_2S_3$ Film Doped Ag, Phys. Stat. Sol. (a) 61, pp. 87–90 (1980).

Holmquist et al., Reaction and Diffusion in Silver–Arsenic Chalcogenide Glass Systems, 62 J. Amer. Ceram. Soc., No. 3–4, pp. 183–188 (Mar.–Apr. 1979).

Huggett et al., Development of silver sensitized germanium selenide photoresist by reactive sputter etching in $SF_6$, 42 Appl. Phys. Lett., No. 7, pp. 592–594 (Apr. 1983).

Kawaguchi et al., Mechanism of photosurface deposition, 164–166 J. Non–Cryst. Solids, pp. 1231–1234 (1983).

Kolobov and Elliott, Photodoping of Amorphous Chalcogenides by Metals, Advances in Physics, vol. 40, No. 5, 625–684 (1991).

Kozicki, et al., "Applications of Programmable Resistance Changes in Metal–doped Chalcogenides," Proceedings of the 1999 Symposium on Solid State Ionic Devices, Editors—E.D. Wachsman et al., The Electrochemical Society, Inc., 1–12 (1999).

Kozicki, et al., Nanoscale effects in devices based on chalcogenide solid solutions, Superlattices and Microstructures 27, 485–488 (2000).

Kozicki, et al., Nanoscale phase separation in Ag–Ge–Se glasses, Microelectronic Engineering, vol. 63/1–3, 155–159 (2002).

M.N. Kozicki, and M. Mitkova, Silver incorporation in thin films of selenium rich Ge–Se glasses, Proceedings of the XIX International Congress on Glass, Society for Glass Technology, 226–227 (2001).

McHardy et al., The dissolution of metals in amorphous chalcogenides and the effects o electron and ultraviolet radiation, 20 J. Phys. C.: Solid State Phys., pp. 4055–4075 (1987)f.

Owen et al., Metal–Chalcogenide Photoresists for High Resolution Lithography and Sub–Micron Structures, Nanostructure Physics and Fabrication, pp. 447–451 (M. Reed ed. 1989).

Shimizu et al., The Photo–Erasable Memory Switching Effect of Ag Photo–Doped Chalcogenide Glasses, 46 B. Chem Soc. Japan, No. 12, pp. 3662–3365 (1973).

Yoji Kawamoto et al., "Ionic Conduction in $As_2S_3$–$Ag_2S$, $GeS_2$–$GeS_2$–$GeS$–$Ag_2S$ and $P_2S_5$–$Ag_2S$ Glasses," Journal of Non–Crystalline Solids 20 (1976) 393–404.

* cited by examiner

PROGRAMMABLE CONDUCTOR RANDOM ACCESS MEMORY AND A METHOD FOR WRITING THERETO

BACKGROUND OF THE INVENTION

1. Field of the Invention

The present invention relates to integrated memory circuits. More specifically, it relates to a method for writing data to a programmable conductor random access memory (PCRAM) cell.

2. Description of Prior Art

DRAM integrated circuit arrays have existed for more than thirty years and their dramatic increase in storage capacity has been achieved through advances in semiconductor fabrication technology and circuit design technology. The considerable advances in these two technologies have also achieved higher and higher levels of integration that permit dramatic reductions in memory array size and cost, as well as increased process yield.

A DRAM memory cell typically comprises, as basic components, an access transistor (switch) and a capacitor for storing a binary data bit in the form of a charge. Typically, a charge of one polarity is stored on the capacitor to represent a logic HIGH (e.g., binary "1"), and a stored charge of the opposite polarity represents a logic LOW (e.g., binary "0"). The basic drawback of a DRAM is that the charge on the capacitor eventually leaks away and therefore provisions must be made to "refresh" the capacitor charge or else the data bit stored by the memory cell is lost.

The memory cell of a conventional SRAM, on the other hand, comprises, as basic components, an access transistor or transistors and a memory element in the form of two or more integrated circuit devices interconnected to function as a bistable latch. An example of such a bistable latch is a pair of cross-coupled inverters. Bistable latches do not need to be "refreshed," as in the case of DRAM memory cells, and will reliably store a data bit indefinitely as long as they continue to receive supply voltage. However, such a memory cell requires a larger number of transistors and therefore amount of silicon real estate than a simple DRAM cell, and draws more power than a DRAM cell.

Efforts continue to identify other forms of memory elements which can store data states and do not require extensive refreshing. Recent studies have focused on resistive materials that can be programmed to exhibit either high or low stable ohmic states. A programmable resistance element of such material could be programmed (set) to a high resistive state to store, for example, a binary "1" data bit or programmed to a low resistive state to store a binary "0" data bit. The stored data bit could then be retrieved by detecting the magnitude of a readout voltage supplying a current switched through the resistive memory element by an access device, thus indicating the stable resistance state it had previously been programmed to.

One particularly promising programmable, bistable resistive material is known as a programmable metalization material, also termed a programmable conductor material. A memory element comprised of such a material has a stable at rest high resistance state, but can be programmed to a stable low resistance state by application of a suitable voltage across the memory element. A reverse voltage of suitable magnitude applied across the memory element can restore the high resistance state. The low resistance state is caused by growth of a conductive dendrite through or on the surface of the programmable conductor material. A programmable conductor memory element is nonvolatile, in that the low resistance state need not be refreshed, or if refreshing is required, it is over a relatively long period, e.g. days or weeks.

One exemplary programmable conductor material comprises a chalcogenide glass material having metal ions diffused therein. A specific example is germanium:selenium ($Ge_xSe_{1-x}$) diffused with silver (Ag) ions. One method of diffusing the silver ions into the germanium:selenium material is to initially evaporate the germanium:selenium glass and then deposit a thin layer of silver upon the glass, for example by sputtering, physical vapor deposition, or other known technique in the art. The layer of silver is irradiated, preferably with electromagnetic energy at a wavelength less than 600 nanometers, so that the energy passes through the silver and to the silver/glass interface, to break a chalcogenide bond of the chalcogenide material. As a result, the Ge:Se glass is doped with silver. Electrodes are provided at spaced locations on the chalcogenide glass to apply voltages for writing and reading the memory element.

Currently, circuitry for writing data to an array of programmable conductor memory elements is being developed. One problem associated with writing a programmable conductor memory element from a high resistance state to a low resistance state is that a driver is used to supply a write voltage at high current, and once the memory element switches to a low resistance state, the high current is still provided by the driver. This results in wasted power.

SUMMARY OF THE INVENTION

The present invention provides an improved write circuit and method for writing a programmable conductor random access memory (PCRAM) cell which reduces wasted power. This is accomplished by utilizing energy stored in the parasitic capacitance of a bit line to supply the write voltage for a programmable conductor memory element. A first predetermined voltage is applied to a first terminal of a programmable conductor memory element and a bit line is charged to a second predetermined voltage. An access transistor couples the precharged bit line to a second terminal of the memory element and the first and second voltages are of a magnitude and polarity which cause the memory element to be written to a desired resistance state. If the first predetermined voltage is held constant, the writing of a memory element to a particular resistance representing a binary value can be controlled by using two different voltages for the second voltage. Since no current supplying driver is used to write a memory element, wasted current is reduced.

BRIEF DESCRIPTION OF THE DRAWINGS

The foregoing and other advantages and features of the invention will become more apparent from the detailed description of preferred embodiments of the invention given below with reference to the accompanying drawings in which.

DETAILED DESCRIPTION OF PREFERRED EMBODIMENTS

The present invention will be described in connection with exemplary embodiments illustrated in FIGS. 1-5. Other embodiments may be realized and other changes may be made to the disclosed embodiments without departing from the spirit or scope of the present invention.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged. Similarly, the terms "germanium" and "selenium" are intended to include not only elemental germanium and selenium, but germanium and selenium with other trace metals or in various alloyed combinations with other metals as known in the semiconductor industry, as long as the physical and electrical properties of the germanium or selenium remain unchanged.

Figure 1:
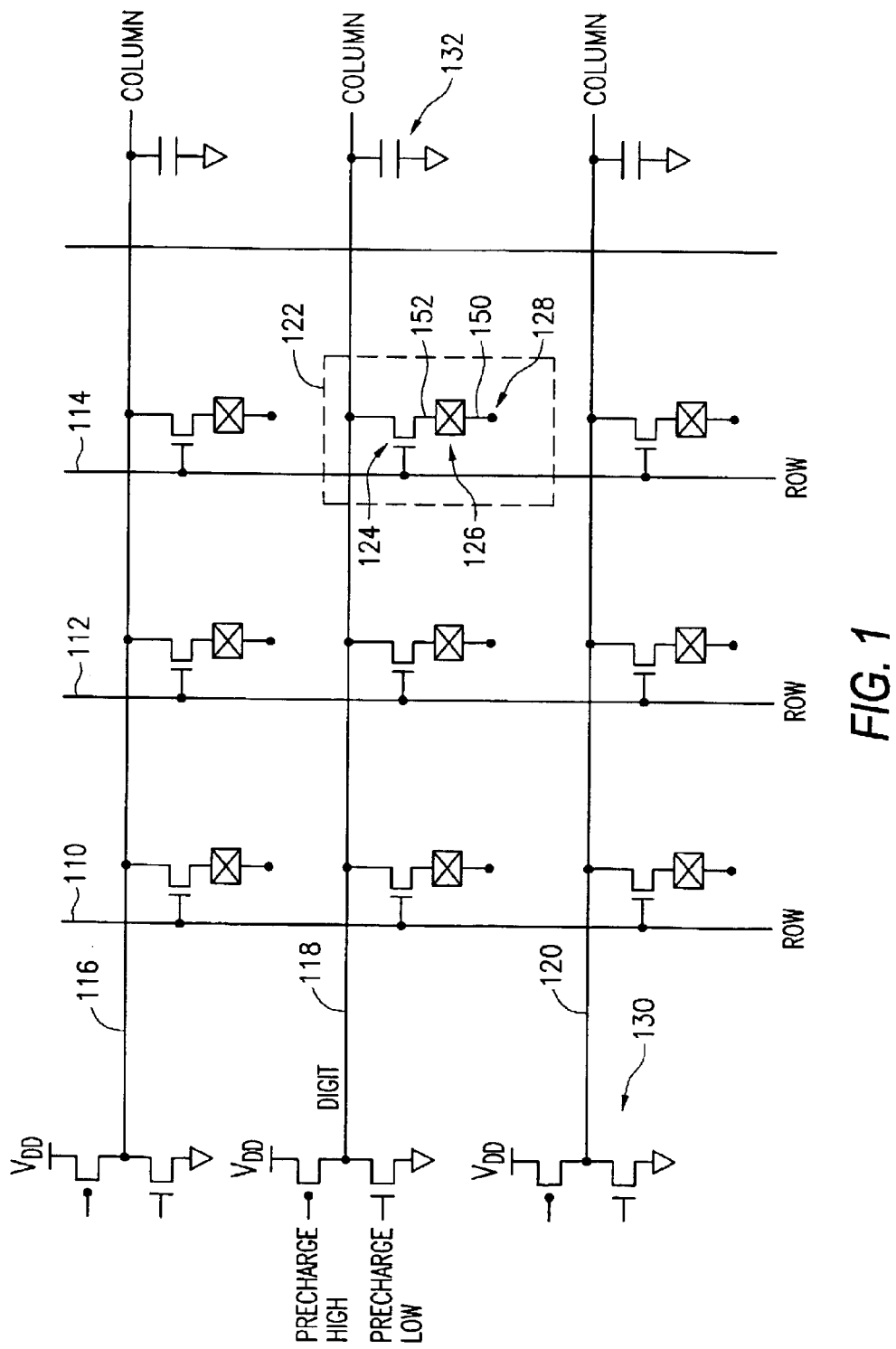
FIG. 1 depicts a memory array employing a plurality of PCRAM memory cells, in accordance with an exemplary embodiment of the invention.

FIG. 1 depicts a memory array 100 having a plurality of row lines 110, 112, 114 and bit (column) lines 116, 118, 120. At each intersection of a row and bin line there is formed a PCRAM cell such as memory cell 122. Each memory cell (e.g., 122) contains an access transistor 124 and a programmable conductor memory element 126. The programmable conductor memory element may be formed of a chalcogenide glass composition of Se:Ge which is doped with Ag. Suitable material composition for element 126 are described in U.S. application Ser. No. 09/941,544 entitled "Stoichiometry for Chalocegenide Glasses Useful for Memory Devices and Method of Formation," the disclosure of which is incorporated herein by reference. According to an exemplary embodiment of the present invention, germanium:selenium glasses for use as memory elements are selected from a range of germanium:selenium glasses having stoichiometries that fall within a first stoichiometric range $R_I$ including $Ge_{18}Se_{82}$ (with a maximum atomic percentage of Ag when doped of about 30% or less) continuously to $Ge_{28}Se_{72}$ (with a maximum atomic percentage of Ag when doped of about 20% or less) and which have the general formula $(Ge_{xI}Se_{I-xI})_{I-yI}Ag_{yI}$, wherein $18 \leq x_I \leq 28$ and wherein $y_I$ represents the fit silver (Ag) atomic percentage which is the maximum amount which will keep the glass in the glass forming region.

A first terminal 150 of the programmable conductor memory element 126 is coupled to a common cell plate 128. One source/drain terminal of each access transistor 124 is coupled to a corresponding bit line (e.g., 118) and another source/drain terminal of each access transistor 124 is coupled to a second terminal 152 of the programmable conductor memory element 126. Further, each bit line 116, 118, 120 is coupled to a precharge circuit 130 so that the bit line can be precharged to one of two predetermined values (e.g., at or approximately at Vdd and at or approximately at ground), as will be described below. Also, a parasitic capacitance 132 is shown for the column line (e.g., 118 of FIG. 1) which is utilized to write, for example, the memory cell 122. The parasitic capacitance has a value of about 500 fF, though this value may vary depending on bit line and memory array architecture.

Figure 2:
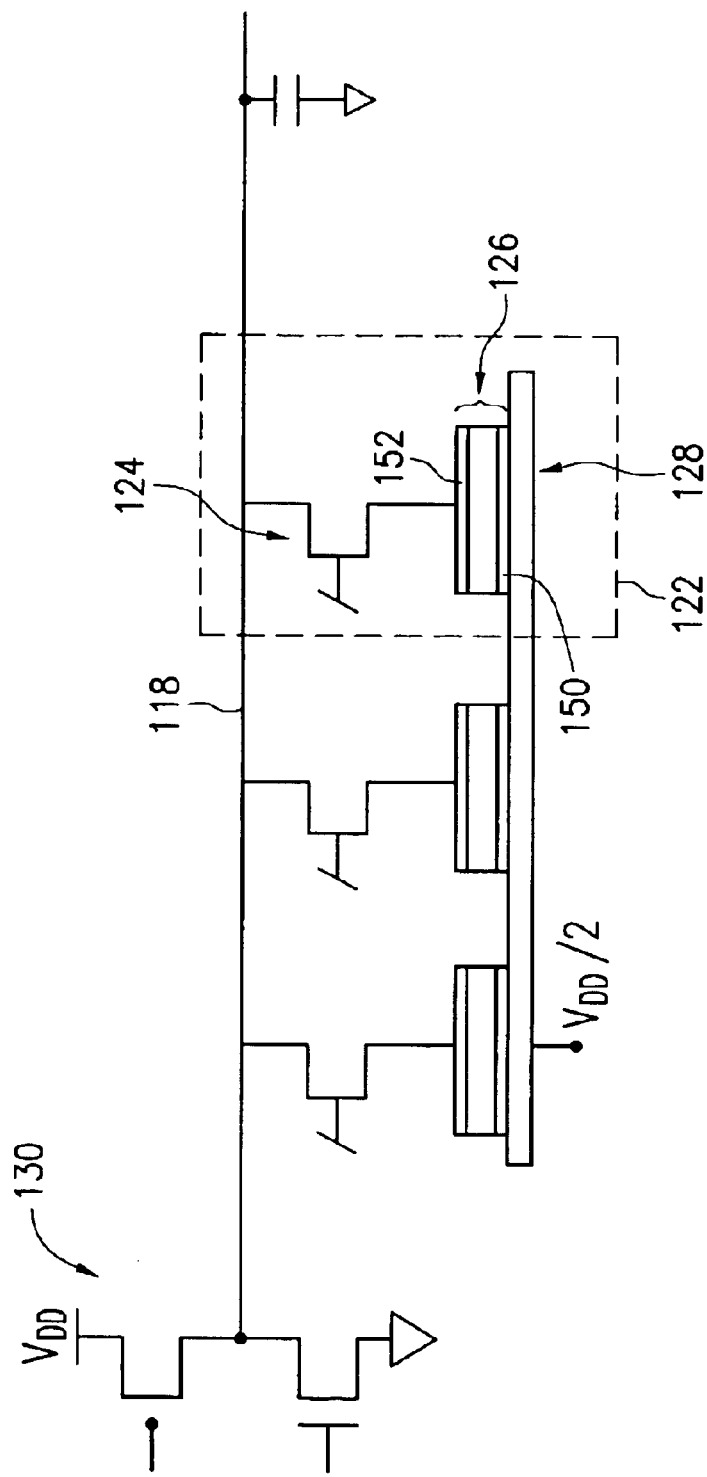
FIG. 2 depicts a PCRAM memory cell of FIG. 1.

Turning to FIG. 2, a schematic diagram of memory cell 122 is depicted in somewhat greater detail. Bit line 118 is coupled to a precharge circuit 130 and also coupled to a first source/drain terminal of access transistor 124, as well as to respective first source/drain terminals of a plurality of other access transistors. Access transistor 124, as well as the other access transistors, are depicted as n-type complementary metal oxide semiconductor (CMOS) transistors. However, access transistor 124 may easily be replaced with a p-type CMOS transistor as long as the corresponding polarities of the other components and voltages are modified accordingly. A first terminal 150 of the programmable memory element 126 is coupled to the common cell plate 128. A second source/drain terminal of transistor 124 is coupled to a second terminal of the programmable conductor memory element 126. As mentioned above, programmable conductor memory element 126 may be made of a Ge:Se chalcogenide glass which is doped with silver, but other programmable conductor materials known to those of ordinary skill in the art may also be used. The programmable conductor memory element 126 is coupled to a common cell plate 128 for a plurality of memory cells. The cell plate 128 is tied to a voltage terminal for providing a predetermined voltage level (e.g., at or approximately at Vdd/2) to the cell plate 128. A gate of each access transistor 124 shown in FIG. 2 is tied to a respective row line 114. When sufficient voltage is applied to a row line, e.g. 114, an associated access transistor 124 is turned on and conducting. The voltages of the row line 114, bit line 118 and cell plate 128 are selected as described below to enable read and write operations of programmable conductor memory element 126.

Figure 3A:
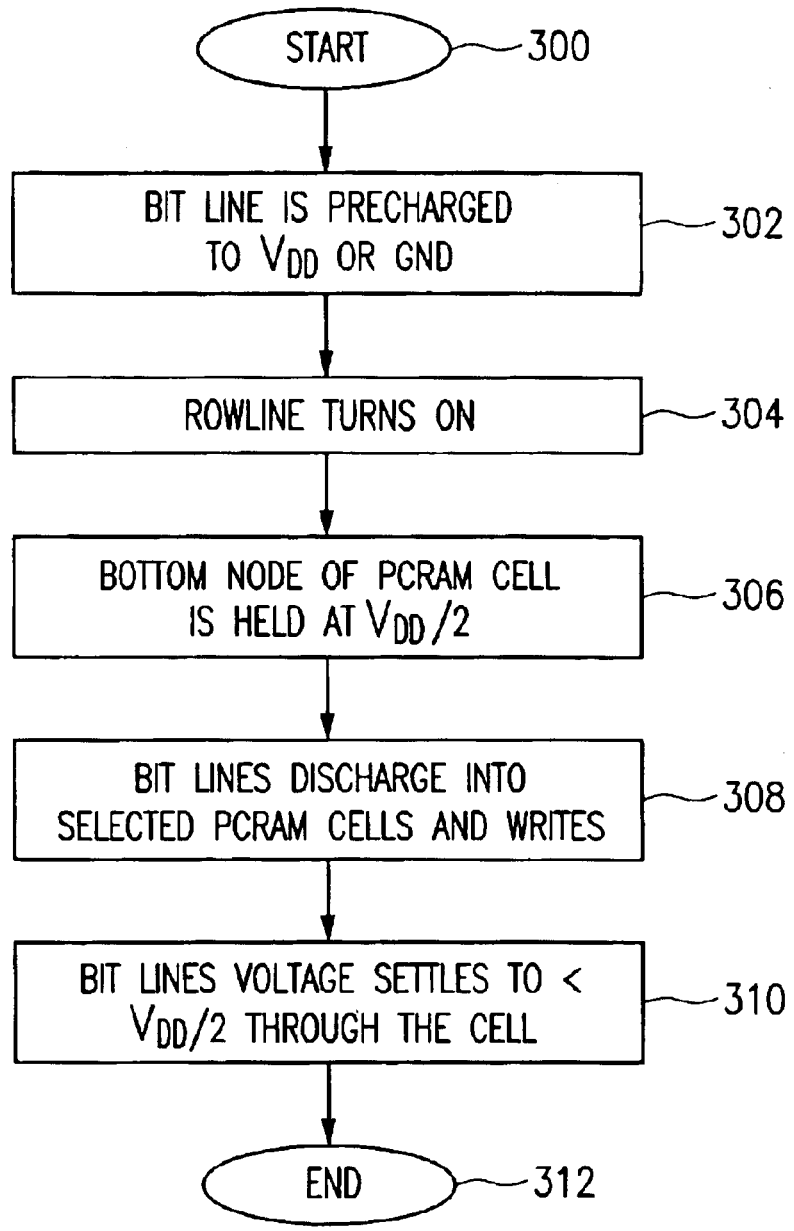
FIG. 3A depicts a flowchart describing an operational flow, in accordance with an exemplary embodiment of the invention.
Figure 3B:
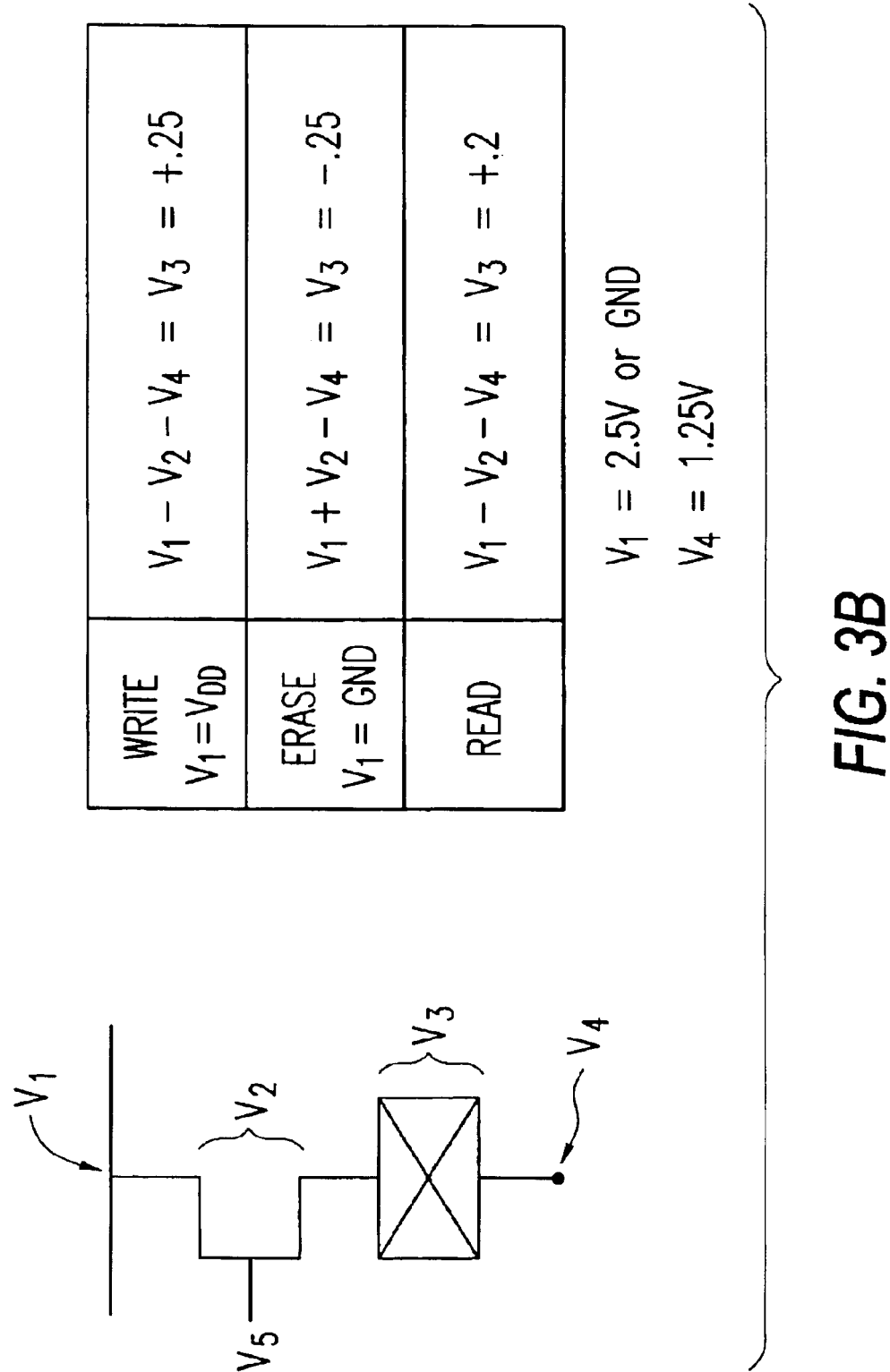
FIG. 3B depicts a voltage arrangement across the PCRAM memory cell of FIG. 1.

FIGS. 3A and 3B, respectively, show a flowchart and voltage chart describing a write operation for a memory cell 122 in accordance with an exemplary embodiment of the invention. In this exemplary process flow, the following parameters of the programmable conductor memory cell are presumed: i) that the voltage across an element 126 required to write from a low resistance state to a high resistance state is 0.25V; (ii) that the current required is approximately 10 $\mu$A; (iii) that the voltage across an element 126 required to write from a high resistance state to a low resistance state is −0.25V; (iv) that the current required is approximately 10 $\mu$A; (v) that the low resistance state is approximately 10K$\Omega$; and (vi) that the high resistance state is any value grater than 10M$\Omega$. It should be readily apparent that alternative parameters may be selected for the PCRAM cell, depending on the material composition and size of the programmable conductor memory element 126, without departing from the spirit and scope of the invention.

Referring to FIG. 3A and FIG. 3B, the write process begins at process segment 300 At segment 302, the bit line, e.g. bit line 118, is initially precharged to at or approximately at either GND or Vdd, depending on whether the cell is to be programmed to a high resistance state or to a low resistance state. If the cell is going to a high resistance state, then the bit line 118 needs to be precharged to ground, and if the cell is going to a low resistance state, then the bit line needs to be precharged to at or approximately at Vdd. Bit line 118 is precharged to a predetermined voltage via precharge circuit 130, respectively coupled to bit line 118. For purposes of this exemplary description, we will assume the bit line voltage is V1, the voltage drop across the access transistor 124 is V2, the voltage across the memory element 126 is V3, the cell plate voltage is V4, and the word line (transistor 124 gate) voltage is V5, as shown in FIG. 3B. We will also assume that Vdd is 2.5V. Accordingly the cell plate 128 is tied to a predetermined voltage of V4, which is at or approximately at Vdd/2, e.g. 1.25V. Note the programmable conductor memory element 126 has reversed voltage write polarities V3 depending on whether a memory element is written to a low resistance state where V3=−0.25V or to a high resistance state where V3=0.25V. Also, a write to a high resistance state is also considered an erase operation. Accordingly, if the cell 122 is going to a low resistance state, then it is necessary to precharge the bit line 118 to at or approximately at Vdd. But if the cell is going to a high resistance state, then the bit line 118 needs to be precharged to at or approximately at ground.

Once the bit line is precharged, a selected row line is fired at process segment 304 by applying a predetermined voltage V5 to that row line. Process segment 300 also shows the cell plate being held at or approximately at Vdd/2. In this example, a predetermined row line voltage V5 of at or approximately at 2.5V (Vdd) is sufficient to turn on the access transistor 124. Since V1=2.5V, V4=1.25V, and the voltage drop V2 across the access transistor is approximately 1 volt (i.e., volt plus resistance of transistor). This leaves a voltage V3 of 0.25V across the memory element 126 which is sufficient to program it from a high resistance to low resistance state, or keep a previously programmed low resistance state intact.

If the bit line 118 is precharged to V1 at or approximately at ground, and the voltage drop V2 across the transistor is approximately 0.2V, then the voltage V3 across memory element 126 is −1.05V, which is sufficient to program it from a low resistance to a high resistance state (also termed an erase) or keep a previously programmed high resistance state intact.

Process segment 308 indicates that the applied voltage across the memory element 126 which is discharged through the memory element to write the selected resistance value therein. By using the parasitic capacitance 132 of the bit line 118 to hold the precharge voltage, the need to drive the bit line 118 with a transistor connected to a voltage source is obviated, reducing current consumption during a write operation. Finally, at processing segment 310, bit line 118 at the end of the write operation voltage settles to a value which is less than the applied cell plate voltage V4, e.g. <at or approximately at Vdd/2.

In order to read the contents of the memory cell 122, or more specifically, in order to read the resistance of the programmable conductor memory element 126 of the memory cell 122, a voltage difference of less than +0.25V is applied across the programmable conductor memory element 126. For example, a voltage of 0.2V can be used for a read operation. This can be achieved by suitable selection voltage during a read operation. For example, a bit line 118 voltage V1, of 2.45V and a voltage drop V2 of 1 volt will produce 0.2 volts across memory element 126.

Figure 4:
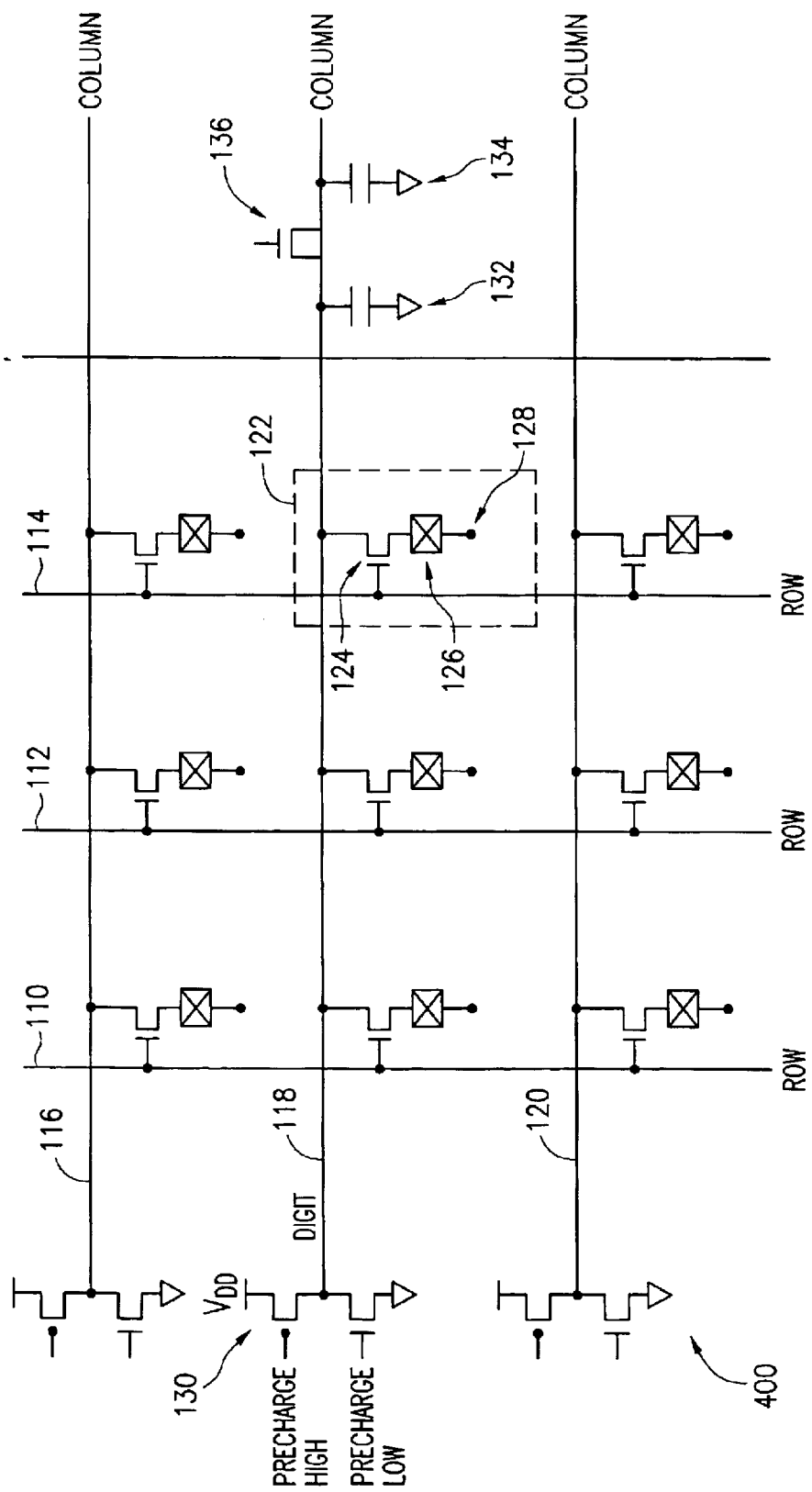
FIG. 4 depicts a memory array employing a plurality of PCRAM memory cells, in accordance with an alternative embodiment of the invention.

Referring now to FIG. 4, a memory array 400 employing a plurality of programmable conductor memory cells 122 is shown comprising parasitic capacitance 132, as well as a capacitor 134 and transistor 136. Those items previously described with reference to FIG. 1 have the same reference number and will not be described here. Capacitor 134 is added to the column line 118 to provide additional capacitance if the parasitic capacitance on the column line 118, for example, provided by capacitance 132, is not sufficiently high enough to store the precharge voltage. Hence, one or more additional capacitors 134 can be provided as needed for a write operation. Transistor 136 is enabled prior to or at the time of a precharge operation to couple one or more added capacitors 134 to the bit line 118. After a write operation, transistor 136 is turned "off" to keep the extra capacitance off the bit line 118 in order to not interfere with the timing of other operations of the memory array 100.

Figure 5:
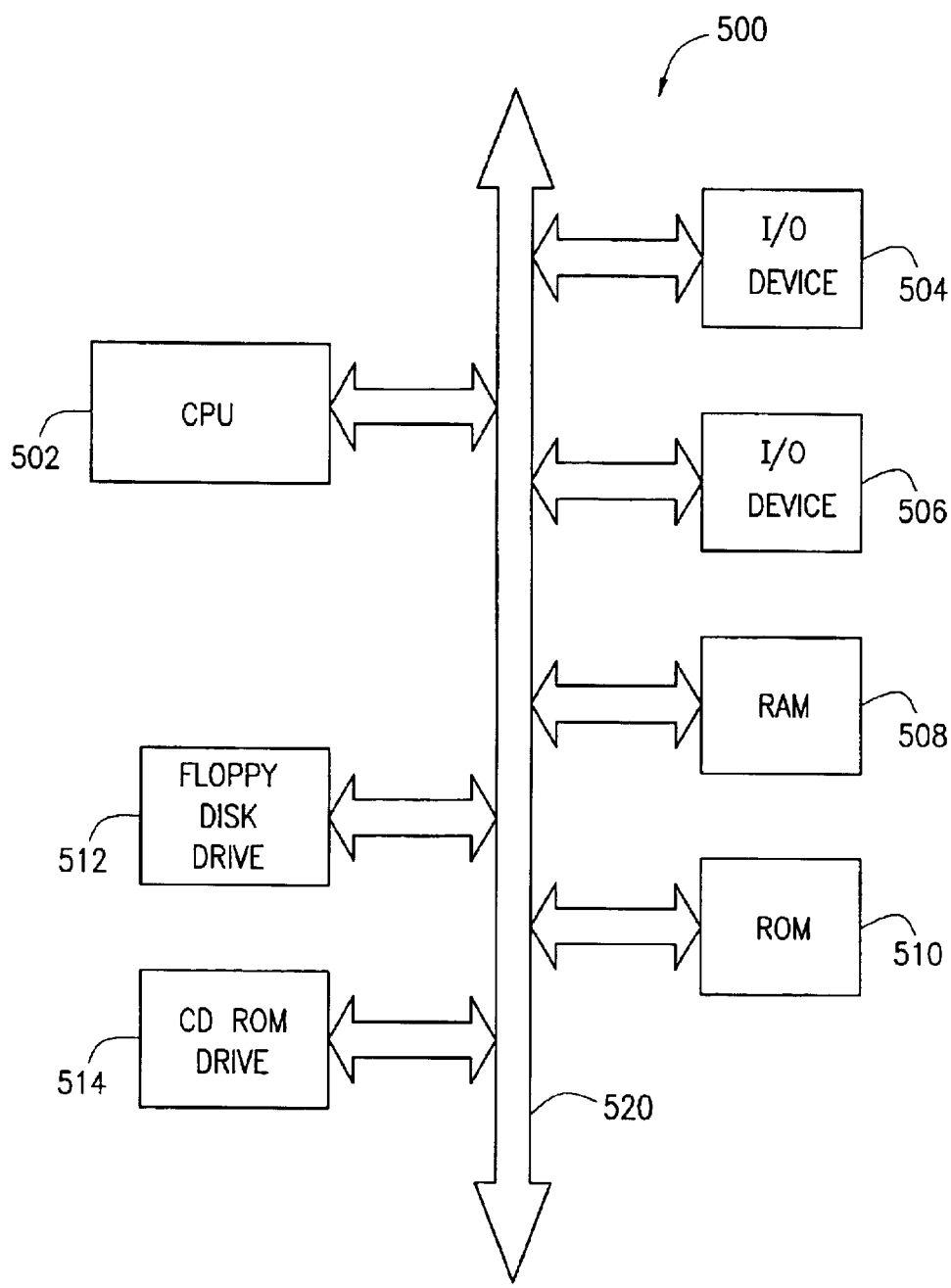
FIG. 5 depicts a block diagram of a processor-based system containing a PCRAM memory, in accordance with an exemplary embodiment of the invention.

FIG. 5 illustrates a block diagram of a processor system 500 containing a programmable conductor random access semiconductor memory as described in connection with FIGS. 1-4. For example, the PCRAM memory array 100 described in connection with FIGS. 1-4 may be part of random access memory (RAM) 508 which may be configured as a plug-in memory module. The processor-based system 500 may be a computer system or any other processor system. The system 500 includes a central processing unit (CPU) 502, e.g., a microprocessor, that communicates with floppy disk drive 512, CD ROM drive 514, and RAM 508 over a bus 520. It must be noted that the bus 520 may be a series of buses and bridges commonly used in a processor-based system, but for convenience purposes only, the bus 520 has been illustrated as a single bus. An input/output (I/O) device (e.g., monitor) 504, 506 may also be connected to the bus 520, but are not required in order to practice the invention. The processor-based system 500 also includes a read-only memory (ROM) 510 which may also be used to store a software program. Although the FIG. 5 block diagram depicts only one CPU 502, the FIG. 5 system could also be configured as a parallel processor machine for performing parallel processing.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific voltage levels, it should be readily apparent that voltage levels very different than those described herein can be used. Also, although the invention has been described in connection with a specific polarity for the memory element 126, that polarity may be reversed resulting in different voltage levels being applied to the transistor, cell plate, and digit line for a write operation as understood by those skilled in the art. Accordingly, the invention is not limited by the foregoing description or drawings, but is only limited by the scope of the appended claims.

What is claimed as new and desired to be protected by Letters Patent of the United States is:

1. A method for writing to a memory element, said method comprising:
   precharging a conductor to a first voltage value, said first voltage being held on said conductor by a capacitance associated with said conductor; and
   coupling a programmable conductor memory element between said first voltage on said conductor and a second voltage to write a predetermined resistance state in said memory element;
   wherein said associated capacitance comprises a capacitor coupled to said conductor.

2. A method for writing to a memory element, said method comprising:
   precharging a conductor to a first voltage value, said first voltage being held on said conductor by a capacitance associated with said conductor; and
   coupling a programmable conductor memory element between said first voltage on said conductor and a second voltage to write a predetermined resistance state in said memory element;

wherein said associated capacitance comprises a parasitic capacitance of said conductor and a capacitor coupled to said conductor.

3. A method for writing to a memory element, said method comprising:
   precharging a conductor to a first voltage value, said first voltage being held on said conductor by a capacitance associated with said conductor; and coupling a programmable conductor memory element between said first voltage on said conductor and a second voltage to write a predetermined resistance state in said memory element;
   wherein said first voltage is at or approximately a supply voltage and said second voltage is approximately one half of said supply voltage.

4. A method for writing to a memory element, said method comprising:
   precharging a conductor to a first voltage value, said first voltage being held on said conductor by a capacitance associated with said conductor; and
   coupling a programmable conductor memory element between said first voltage on said conductor and a second voltage to write a predetermined resistance state in said memory element;
   wherein said first voltage is ground and said second voltage is at or approximately at one half of a supply voltage.

5. A method for writing to a memory element, said method comprising:
   precharging a conductor to a first voltage value, said first voltage being held on said conductor by a capacitance associated with said conductor; and
   coupling a programmable conductor memory element between said first voltage on said conductor and a second voltage to write a predetermined resistance state in said memory element;
   wherein said memory element comprises a chalcogenide glass memory element and said chalcogenide glass memory element comprises a germanium:selenium glass composition which is doped with silver.

6. A method for writing a semiconductor memory cell, the method comprising:
   applying a first predetermined voltage to a first terminal of a programmable conductor memory element;
   charging a bit line of a memory array to which said memory cell belongs to a second predetermined voltage, said bit line having a parasitic capacitance which stores said second predetermined voltage;
   applying a third predetermined voltage to a gate of a transistor to enable said transistor and couple said bit line to a second terminal of said programmable conductor memory element; and
   using a voltage across said memory element when said transistor is enabled to establish a resistance state of said memory element;
   wherein said first predetermined voltage is at or approximately at one half of a supply voltage and said second predetermined voltage is at or approximately at said supply voltage.

7. A method for writing a semiconductor memory cell, the method comprising:
   applying a first predetermined voltage to a first terminal of a programmable conductor memory element;
   charging a bit line of a memory array to which said memory cell belongs to a second predetermined voltage, said bit line having a parasitic capacitance which stores said second predetermined voltage;
   applying a third predetermined voltage to a gate of a transistor to enable said transistor and couple said bit line to a second terminal of said programmable conductor memory element; and
   using a voltage across said memory element when said transistor is enabled to establish a resistance state of said memory element;
   wherein said first predetermined voltage is at or approximately at one half of a supply voltage and said second predetermined voltage is at or approximately at ground.

8. A method for writing a semiconductor memory cell, the method comprising:
   applying a first predetermined voltage to a first terminal of a programmable conductor memory element;
   charging a bit line of a memory array to which said memory cell belongs to a second predetermined voltage, said bit line having a parasitic capacitance which stores said second predetermined voltage;
   applying a third predetermined voltage to a gate of a transistor to enable said transistor and couple said bit line to a second terminal of said programmable conductor memory element; and
   using a voltage across said memory element when said transistor is enabled to establish a resistance state of said memory element;
   wherein said act of applying a first predetermined voltage comprises coupling a cell plate, to which said first terminal is coupled, to a source of said first predetermined voltage.

9. A method for writing a semiconductor memory cell, the method comprising:
   applying a first predetermined voltage to a first terminal of a programmable conductor memory element;
   charging a bit line of a memory array to which said memory cell belongs to a second predetermined voltage, said bit line having a parasitic capacitance which stores said second predetermined voltage;
   applying a third predetermined voltage to a gate of a transistor to enable said transistor and couple said bit line to a second terminal of said programmable conductor memory element; and
   using a voltage across said memory element when said transistor is enabled to establish a resistance state of said memory element; and
   selectively coupling at least one capacitor to said bit line to store said second predetermined voltage.

10. The method of claim 9 further comprising enabling a transistor to selectively couple at least one capacitor to said bit line.

11. A method for writing a semiconductor memory cell, the method comprising:
    applying a first predetermined voltage to a first terminal of a programmable conductor memory element;
    charging a bit line of a memory array to which said memory cell belongs to a second predetermined voltage, said bit line having a parasitic capacitance which stores said second predetermined voltage;
    applying a third predetermined voltage to a gate of a transistor to enable said transistor and couple said bit line to a second terminal of said programmable conductor memory element; and
    using a voltage across said memory element when said transistor is enabled to establish a resistance state of said memory element;

wherein said parasitic capacitance has a value of about 500 fF.

12. A method for writing a semiconductor memory cell, the method comprising:
applying a first predetermined voltage to a first terminal of a programmable conductor memory element;
charging a bit line of a memory array to which said memory cell belongs to a second predetermined voltage, said bit line having a parasitic capacitance which stores said second predetermined voltage;
applying a third predetermined voltage to a gate of a transistor to enable said transistor and couple said bit line to a second terminal of said programmable conductor memory element; and
using a voltage across said memory element when said transistor is enabled to establish a resistance state of said memory element;
wherein said programmable conductor memory element comprises a chalcogenide glass.

13. The method of claim 12 wherein said chalcogenide glass comprises a Ge:Se glass composition which is doped with silver.

14. A method of operating a memory cell comprising:
precharging a bit line to a first voltage;
applying a second voltage to a first terminal of a chalcogenide memory element;
connecting a second terminal of said chalcogenide memory element to said bit line to produce a voltage across said memory element sufficient to write a predetermined resistance state into said memory element; and
selectively coupling at least one capacitor to said bit line to receive and store said first voltage.

15. The method of claim 14 further comprising operating a transistor to selectively couple said at least one capacitor to said bit line.

16. A method of operating a memory cell comprising:
precharging a bit line to a first voltage;
applying a second voltage to a first terminal of a chalcogenide memory element; and
connecting a second terminal of said chalcogenide memory element to said bit line to produce a voltage across said memory element sufficient to write a predetermined resistance state into said memory element;
wherein said bit line has a parasitic capacitance of about 500 fF.

17. A method of operating a memory cell comprising:
precharging a bit line to a first voltage;
applying a second voltage to a first terminal of a chalcogenide memory element; and
connecting a second terminal of said chalcogenide memory element to said bit line to produce a voltage across said memory element sufficient to write a predetermined resistance state into said memory element;
wherein said chalcogenide memory element comprises a Ge:Se glass composition doped with silver.

18. A memory structure comprising:
a conductor having an associated capacitance;
a precharge circuit for precharging said conductor to a first voltage, said first voltage being held on said conductor by said associated capacitance;
a programmable conductor memory element having one terminal connected to a second voltage; and
an access device for selectively coupling a second terminal of said memory element to said conductor, said access device enabling said first and second voltages to establish a voltage across said programmable element sufficient to program said memory element to one of a higher and lower resistance state;
wherein said precharge circuit supplies a first voltage of a supply voltage to program a higher resistance state into said memory element and a second voltage of ground potential as said first voltage to program a lower resistance state into said memory element, and said second voltage is at or approximately at one half of said supply voltage.

19. A memory structure comprising:
a conductor having an associated capacitance;
a precharge circuit for precharging said conductor to a first voltage, said first voltage being held on said conductor by said associated capacitance;
a programmable conductor memory element having one terminal connected to a second voltage; and
an access device for selectively coupling a second terminal of said memory element to said conductor, said access device enabling said first and second voltages to establish a voltage across said programmable element sufficient to program said memory element to one of a higher and lower resistance state;
wherein said associated capacitance comprises at least one capacitor coupled to said conductor.

20. A memory structure comprising:
a conductor having an associated capacitance;
a precharge circuit for precharging said conductor to a first voltage, said first voltage being held on said conductor by said associated capacitance;
a programmable conductor memory element having one terminal connected to a second voltage; and
an access device for selectively coupling a second terminal of said memory element to said conductor, said access device enabling said first and second voltages to establish a voltage across said programmable element sufficient to program said memory element to one of a higher and lower resistance state;
wherein said associated capacitance comprises a parasitic capacitance of said conductor and at least one capacitor coupled to said conductor.

21. A memory structure comprising:
a conductor having an associated capacitance;
a precharge circuit for precharging said conductor to a first voltage, said first voltage being held on said conductor by said associated capacitance;
a programmable conductor memory element having one terminal connected to a second voltage; and
an access device for selectively coupling a second terminal of said memory element to said conductor, said access device enabling said first and second voltages to establish a voltage across said programmable element sufficient to program said memory element to one of a higher and lower resistance state;
wherein said memory element comprises a chalcogenide glass memory element and said chalcogenide glass memory element comprises a Ge:Se glass composition which is doped with silver.

22. A semiconductor memory comprising:
a bit line having an associated capacitance;
a programmable conductor memory element having first and second terminals;

a precharge circuit for precharging said bit line to one of two possible voltage values depending on a desired state of resistance programming of said memory element, said associated capacitance holding a precharge voltage value on said bit line;

a cell plate coupled to a first terminal of said memory element for supplying a third voltage value to said first terminal; and an access transistor responsive to a voltage on a word line for selectively coupling said bit line to said second terminal of said memory element to program said memory element to a resistance state based on the voltage values on said cell plate and bit line;

wherein said associated capacitance comprises at least one capacitor coupled to said conductor.

23. The semiconductor memory of claim 22 further comprising a switching device for selectively coupling said at least one capacitor to said bit line.

24. A semiconductor memory comprising:

a bit line having an associated capacitance;

a programmable conductor memory element having first and second terminals;

a precharge circuit for precharging said bit line to one of two possible voltage values depending on a desired state of resistance programming of said memory element, said associated capacitance holding a precharge voltage value on said bit line;

a cell plate coupled to a first terminal of said memory element for supplying a third voltage value to said first terminal; and an access transistor responsive to a voltage on a word line for selectively coupling said bit line to said second terminal of said memory element to program said memory element to a resistance state based on the voltage values on said cell plate and bit line;

wherein said associated capacitance comprises a parasitic capacitance of said conductor and at least one capacitor coupled to said conductor.

25. The semiconductor memory of claim 24 comprising a switching device for selectively coupling said at least one capacitor to said bit line.

26. A semiconductor memory comprising:

a bit line having an associated capacitance;

a programmable conductor memory element having first and second terminals;

a precharge circuit for precharging said bit line to one of two possible voltage values depending on a desired state of resistance programming of said memory element, said associated capacitance holding a precharge voltage value on said bit line;

a cell plate coupled to a first terminal of said memory element for supplying a third voltage value to said first terminal; and an access transistor responsive to a voltage on a word line for selectively coupling said bit line to said second terminal of said memory element to program said memory element to a resistance state based on the voltage values on said cell plate and bit line;

wherein said memory element comprises a chalcogenide glass memory element and said chalcogenide glass memory element comprises a Ge:Se glass composition which is doped with silver.

27. A semiconductor memory comprising:

a bit line having an associated capacitance;

a programmable conductor memory element having first and second terminals;

a precharge circuit for precharging said bit line to one of two possible voltage values depending on a desired state of resistance programming of said memory element, said associated capacitance holding a precharge voltage value on said bit line;

a cell plate coupled to a first terminal of said memory element for supplying a third voltage value to said first terminal; and an access transistor responsive to a voltage on a word line for selectively coupling said bit line to said second terminal of said memory element to program said memory element to a resistance state based on the voltage values on said cell plate and bit line;

wherein said parasitic capacitance has a value of about 500 fF.

28. A memory comprising:

a chalcogenide memory element having first and second terminals;

a first memory line;

a circuit for selectively precharging said first memory line to either a first or second voltage;

a circuit for supplying a third voltage to the first terminal of said chalcogenide element;

a device for switchably coupling the second terminal of said chalcogenide memory element to said first memory line after said first memory line has been precharged, said device causing a voltage to be applied across said chalcogenide memory element sufficient to write one of two predetermined resistance states in said chalcogenide element depending on which of said first or second voltage is precharged on said memory line; and at least one capacitor coupled to said memory line to receive and hold said precharge voltage.

29. The memory cell of claim 28 further comprising a switching device for selectively coupling said at least one capacitor to said memory line.

30. A memory comprising:

a chalcogenide memory element having first and second terminals;

a first memory line;

a circuit for selectively precharging said first memory line to either a first or second voltage;

a circuit for supplying a third voltage to the first terminal of said chalcogenide element; and a device for switchably coupling the second terminal of said chalcogenide memory element to said first memory line after said first memory line has been precharged, said device causing a voltage to be applied across said chalcogenide memory element sufficient to write one of two predetermined resistance states in said chalcogenide element depending on which of said first or second voltage is precharged on said memory line;

wherein said memory line has a parasitic capacitance of about 500 fF.

31. A memory comprising:

a chalcogenide memory element having first and second terminals;

a first memory line;

a circuit for selectively precharging said first memory line to either a first or second voltage;

a circuit for supplying a third voltage to the first terminal of said chalcogenide element; and a device for switchably coupling the second terminal of said chalcogenide memory element to said first memory line after said first memory line has been precharged, said device causing a voltage to be applied across said chalcogenide memory element sufficient to write one of two predetermined resistance states in said chalcogenide element depending on which of said first or second voltage is precharged on said memory line;

wherein said chalcogenide memory element comprises a germanium:selenium glass composition which is doped with silver.

32. A processor system comprising:

a processor; and a semiconductor memory coupled to said processor, said semiconductor memory comprising:
- a conductor having an associated capacitance;
- a precharge circuit for precharging said conductor to a first voltage, said first voltage being held on said conductor by said associated capacitance;
- a programmable conductor memory element having one terminal connected to a second voltage; and
- an access device for selectively coupling a second terminal of said memory element to said conductor, said access device enabling said first and second voltages to establish a voltage across said programmable element sufficient to program said memory element to one of a higher and lower resistance state;

wherein said precharge circuit supplies a supply voltage as said first voltage to program a higher resistance state into said memory element and ground potential as said first voltage to program a lower resistance state into said memory element, and said second voltage is at or approximately at one half of said supply voltage.

33. A processor system comprising:

a processor; and a semiconductor memory coupled to said processor, said semiconductor memory comprising:
- a conductor having an associated capacitance;
- a precharge circuit for precharging said conductor to a first voltage, said first voltage being held on said conductor by said associated capacitance;
- a programmable conductor memory element having one terminal connected to a second voltage; and
- an access device for selectively coupling a second terminal of said memory element to said conductor, said access device enabling said first and second voltages to establish a voltage across said programmable element sufficient to program said memory element to one of a higher and lower resistance state;

wherein said associated capacitance comprises at least one capacitor coupled to said conductor.

34. A processor system comprising:

a processor; and a semiconductor memory coupled to said processor, said semiconductor memory comprising:
- a conductor having an associated capacitance;
- a precharge circuit for precharging said conductor to a first voltage, said first voltage being held on said conductor by said associated capacitance;
- a programmable conductor memory element having one terminal connected to a second voltage; and
- an access device for selectively coupling a second terminal of said memory element to said conductor, said access device enabling said first and second voltages to establish a voltage across said programmable element sufficient to program said memory element to one of a higher and lower resistance state;

wherein said associated capacitance comprises a parasitic capacitance of said conductor and at least one capacitor coupled to said conductor.

35. A processor system comprising:

a processor; and a semiconductor memory coupled to said processor, said semiconductor memory comprising:
- a conductor having an associated capacitance;
- a precharge circuit for precharging said conductor to a first voltage, said first voltage being held on said conductor by said associated capacitance;
- a programmable conductor memory element having one terminal connected to a second voltage; and
- an access device for selectively coupling a second terminal of said memory element to said conductor, said access device enabling said first and second voltages to establish a voltage across said programmable element sufficient to program said memory element to one of a higher and lower resistance state;

wherein said chalcogenide glass memory element comprises a Ge:Se glass composition which is doped with silver.

* * * * *